(12) United States Patent
Kishida et al.

(10) Patent No.: US 7,343,788 B2
(45) Date of Patent: Mar. 18, 2008

(54) METHOD FOR TIRE ROLLING SIMULATION ON SAND

(75) Inventors: Masahiro Kishida, Kobe (JP); Masaki Shiraishi, Kobe (JP)

(73) Assignee: Sumitomo Rubber Industries, Ltd., Kobe-shi (JP)

( * ) Notice: Subject to any disclaimer, the term of this patent is extended or adjusted under 35 U.S.C. 154(b) by 0 days.

(21) Appl. No.: 11/583,702

(22) Filed: Oct. 20, 2006

(65) Prior Publication Data

US 2007/0107506 A1 May 17, 2007

(30) Foreign Application Priority Data

Oct. 24, 2005 (JP) .............................. 2005-309113

(51) Int. Cl.
*E01C 23/00* (2006.01)

(52) U.S. Cl. ...................................... 73/146

(58) Field of Classification Search ................. 73/146, 73/146.8, 146.2
See application file for complete search history.

(56) References Cited

U.S. PATENT DOCUMENTS

| 6,324,461 | B1 * | 11/2001 | Yamaguchi et al. .......... 701/80 |
| 6,925,865 | B2 * | 8/2005 | Oku ............................. 73/146 |
| 2002/0134149 | A1 | 9/2002 | Shiraishi et al. | |

FOREIGN PATENT DOCUMENTS

| EP | 1293917 B1 | 3/2003 |
| EP | 1473559 A2 | 11/2004 |

OTHER PUBLICATIONS

Mundl et al., Tire Science & Technology, vol. 25, No. 4, Oct.-Dec. 1997, pp. 245-264.
Okano et al., Tire Science & Technology, vol. 29, No. 1, Jan.-Mar. 2001, pp. 2-22.
Schmid et al., Seoul 2000 FISITA World Automotive Congress Jun. 12-15, 2000, Seoul Korea.
Meschke et al., Computer Methods and Advances in Geomechanics, Siriwardane & Zaman (eds) 1994.
Fervers, Journal of Terramechanics, vol. 41, pp. 87-100, (2004) XP-002408763.
Liu et al., Journal of Terramechanics, vol. 33, No. 5, pp. 209-221 (1996).
Woodward et al. Int. J. Numer. Anal. Meth. Geomech., vol. 23, pp. 1995-2043, (1999) XP-002408762.

* cited by examiner

*Primary Examiner*—Jewel Thompson
(74) *Attorney, Agent, or Firm*—Birch, Stewart, Kolasch & Birch, LLP

(57) ABSTRACT

A method for tire rolling simulation on sand comprises the steps of modeling a tire using finite elements to build a tire model, modeling a sandy road using finite volumes to build a sandy road model which can exhibit elastoplasticity with both elastic and plastic properties, and executing a numerical simulation in which the tire model is made to roll on the sandy road model in a predetermined condition.

4 Claims, 17 Drawing Sheets

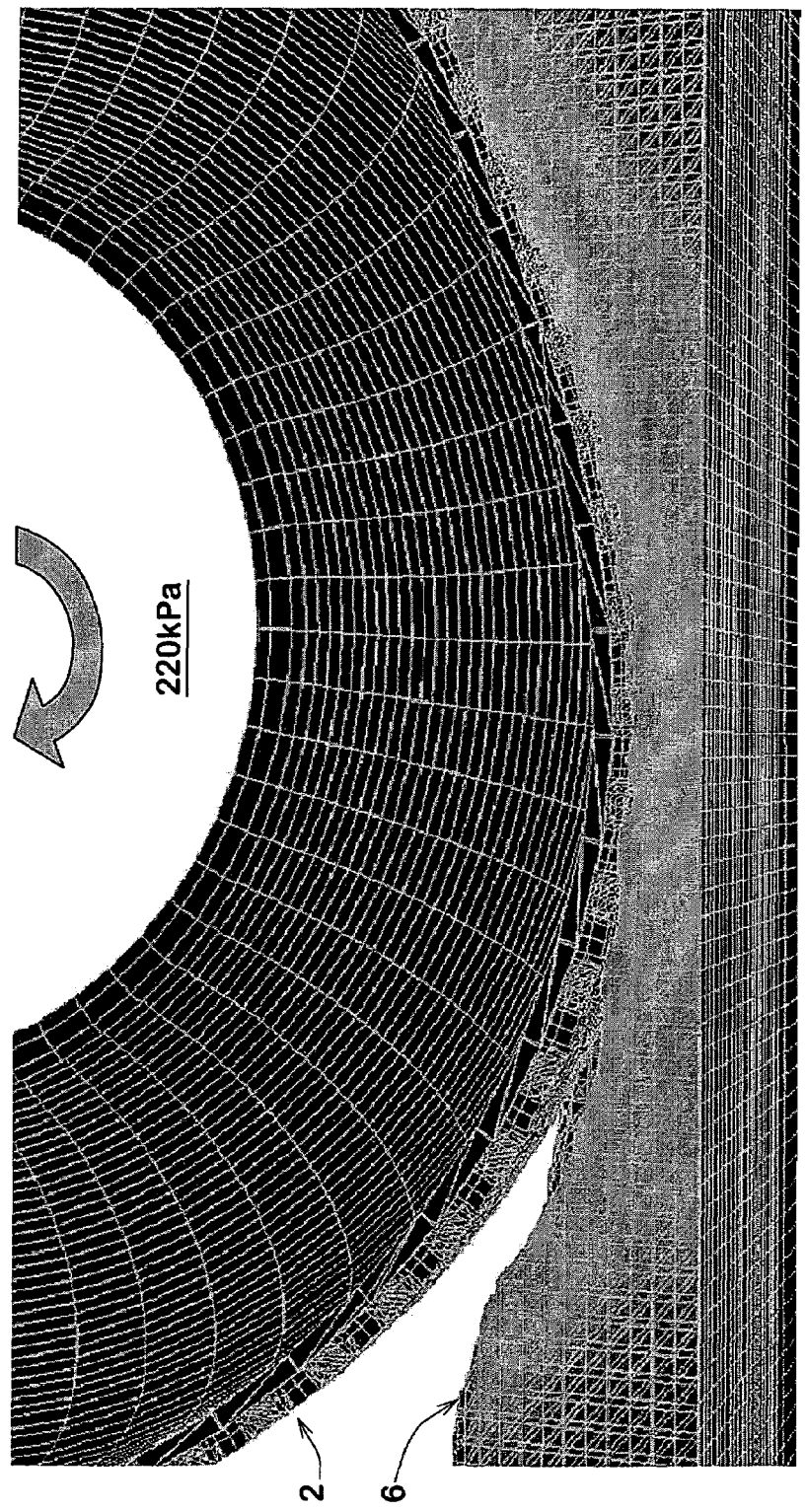

METHOD FOR TIRE ROLLING SIMULATION ON SAND

BACKGROUND OF THE INVENTION

1. Field of the Invention

The present invention relates to a method for tire rolling simulation capable of predicting a tire performance on sand.

2. Background Art

Conventionally, tires have been developed by a procedure of prototype manufacturing, actual testing, and improved product manufacturing based on the results of the tests. This approach, however, is inefficient because prototype manufacturing and testing demand a lot of cost and time. To solve this drawback, computer simulation using a numerical analysis method, such as the finite element method, have been suggested. This approach enables the prediction of tire performance without manufacturing prototype tires.

Conventional simulation, however, is only performed on dry asphalt, wet asphalt or clay-like roads in which volume change remains, such as snow. Therefore, the conventional approaches fail to accurately predict tire performance running on sand.

SUMMARY OF THE INVENTION

It is a main object of the present invention to provide a method for tire rolling simulation which can simulate the tire performance on sand.

According to the present invention, a method for tire rolling simulation on sand comprises the steps of modeling a tire using finite elements to build a tire model, modeling a sandy road covered with sand using finite volumes to build a sandy road model which can exhibit elastoplasticity with both elastic and plastic properties, and executing a numerical simulation in which the tire model is made to roll on the sandy road model in a predetermined condition.

BRIEF DESCRIPTION OF THE DRAWINGS

FIGS. 17 to 19 are side views of the tire model and the sandy road model showing results of the simulation.

DESCRIPTION OF THE PREFERRED EMBODIMENTS

An embodiment of the present invention will be described as follows based on the drawings.

The simulation method of this embodiment is to roll a tire model 2 on a road covered with thick sand layer such as a desert. Here, sand comprises a mixture of sand particles of at least one kind of: silt having a particle size of from 0.005 to 0.075 mm; fine sand having a particle size of from 0.075 to 0.250 mm; medium sand having a particle size of from 0.250 to 0.850 mm; fine gravel having a particle size of from 0.850 to 2.00 mm; or granule having a particle size of from 2.00 to 4.75 mm. In order to set a desert condition, the particle size is preferably set in the range of from 0.005 to 2.0 mm.

In a natural free state, the mixture of sand particles keeps its volume at a minimum by well arranging sand random particles. However, when a compressive force is applied to the mixture, the arrangement of the particles changes so that gaps between the particles are enlarged. Therefore, it is a unique property of sand that the apparent volume of the mixture is enlarged when a compressive force is applied.

Figure 1:
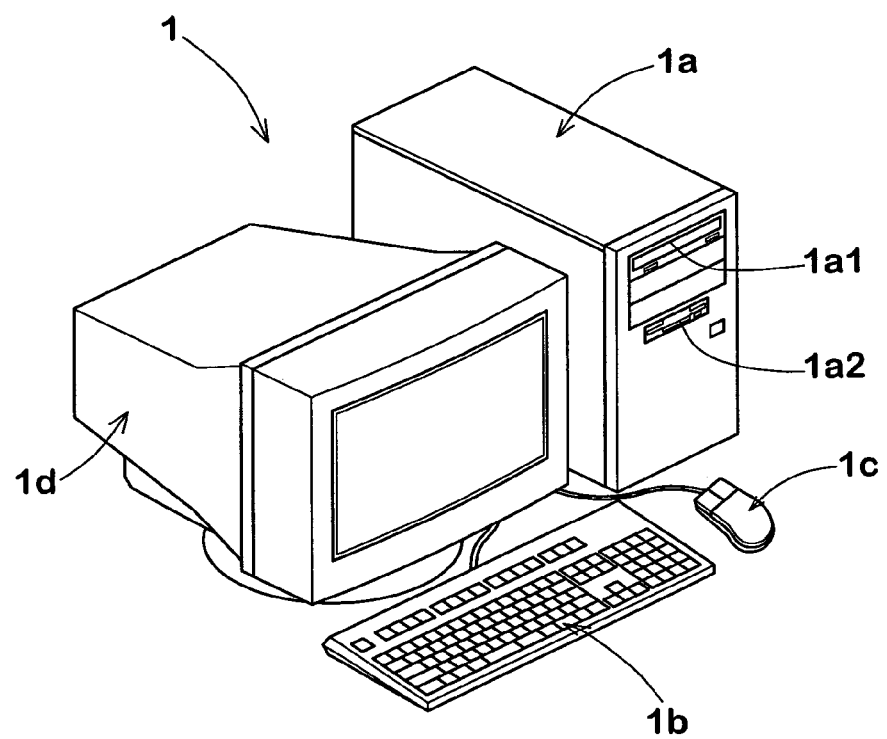
FIG. 1 is an illustration of a computer device for executing the simulation method.

FIG. 1 shows a computer device 1 used for the simulation method of the present invention. The computer device 1 comprises a main body $1a$, a key board $1b$, a mouse $1c$, and a display device $1d$. The main body $1a$ includes disk drives $1a1$ and $1a2$, a CPU, a ROM, a memory, and a bulk storage (which are not illustrated). The bulk storage stores programs which execute the simulation method described below.

Figure 2:
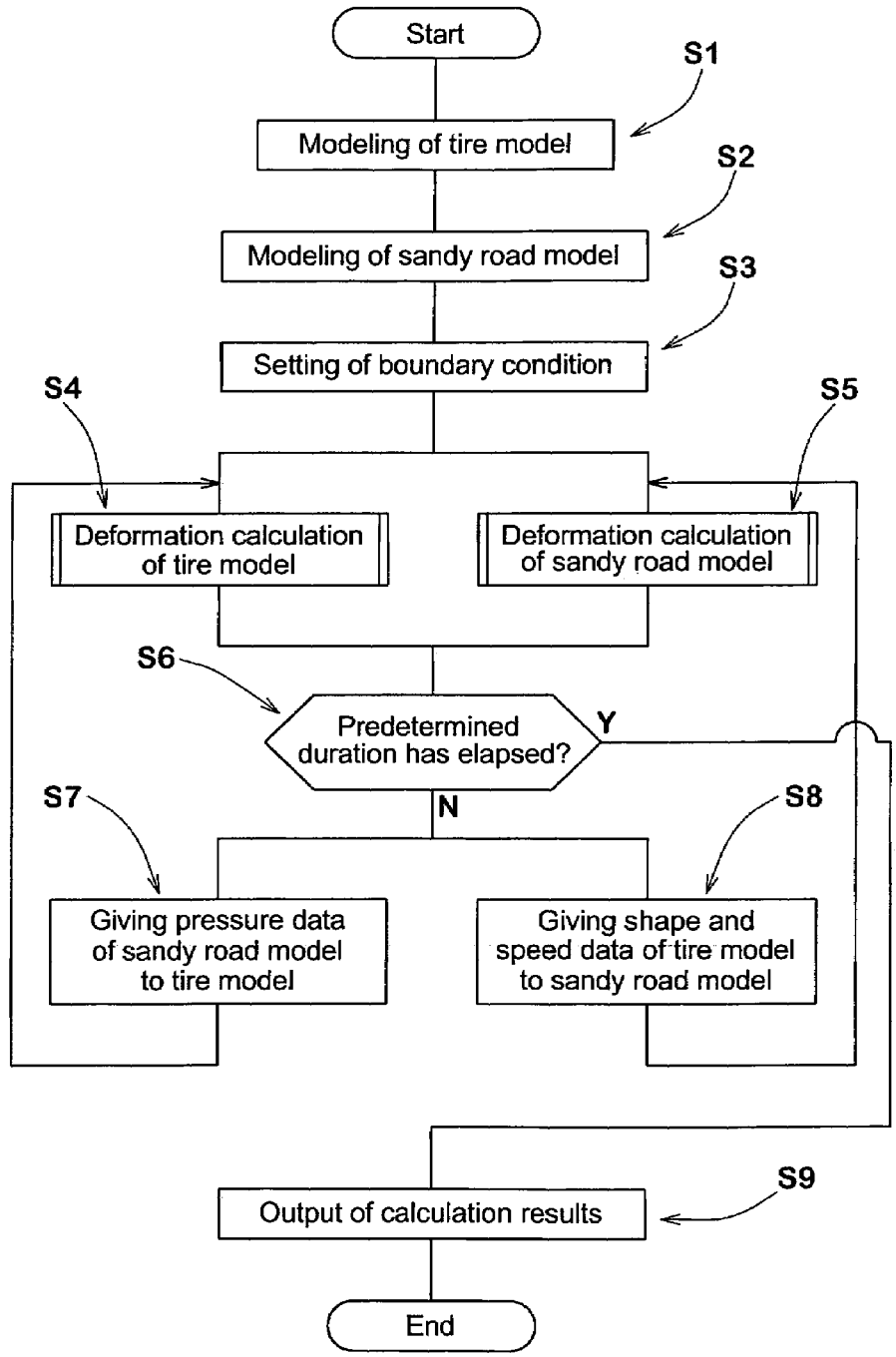
FIG. 2 is a flowchart showing an example of the simulation method.

FIG. 2 shows an example of the procedure of the invention simulation method. In the Step S1, a tire model 2 is set by modeling a tire using finite elements capable of numerical analysis. The numerical analysis includes, for example, the finite element method, the finite volume method, the finite difference method and the boundary element method. In this example, the finite element method and the finite volume method are employed.

Figure 3:
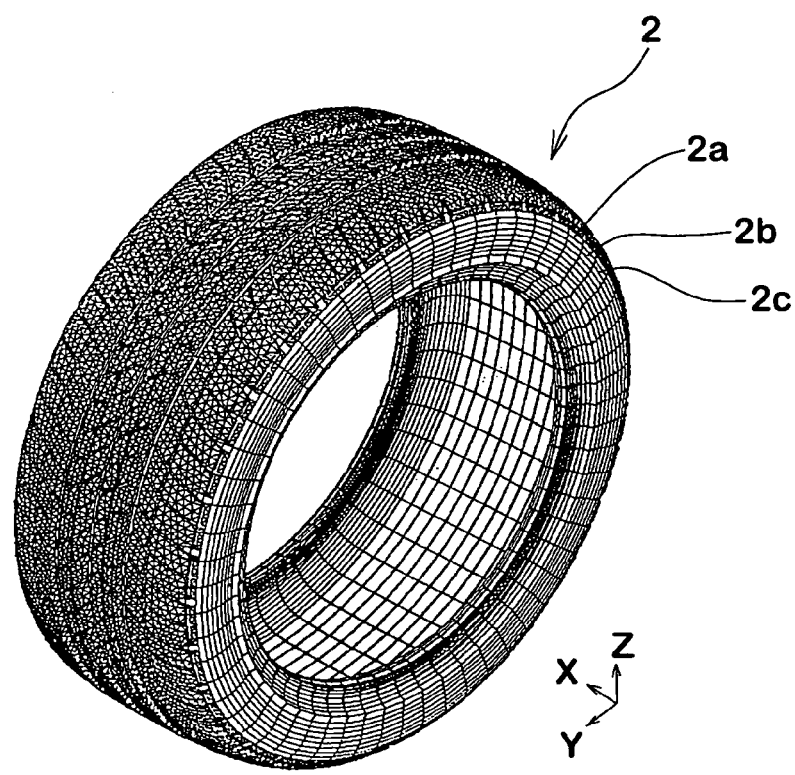
FIG. 3 is a perspective view of a tire model.

FIG. 3 is an example of the tire model 2 which is visualized in three-dimensional. In the tire model 2, the tire to be analyzed is divided into a finite number of small elements (LaGrange elements) $2a$, $2b$, $2c$ which are numerical data capable of calculation by the computer device 1. Further, the tire model 2 includes the coordinate values of the nodal points of each element $2a$, $2b$, $2c$ ..., their shapes, and their properties such as density, Young's modulus, damping coefficient. Each of the elements $2a$, $2b$, $2c$ ... can be, but not limited to, rectangular plane elements or three-dimensional tetrahedral solid elements. Other various elements such as pentagonal and/or hexagonal solid elements are also employed.

Most of the rubber part of the tire is modeled using mainly three-dimensional solid elements. The tire model 2 shown in FIG. 3 is provided with tread grooves on the tread including longitudinal and transverse grooves, but these may be omitted. The circumferential length of one element arranged on the tread of the tire model 2 does not preferably exceed 25% of a circumferential length of the tread ground contact portion. This is useful for correct expression of the tread ground contact pressure or the distribution of the shearing force. The length of one element in the axial direction of the tire is preferably 20 mm or less.

Figure 4:
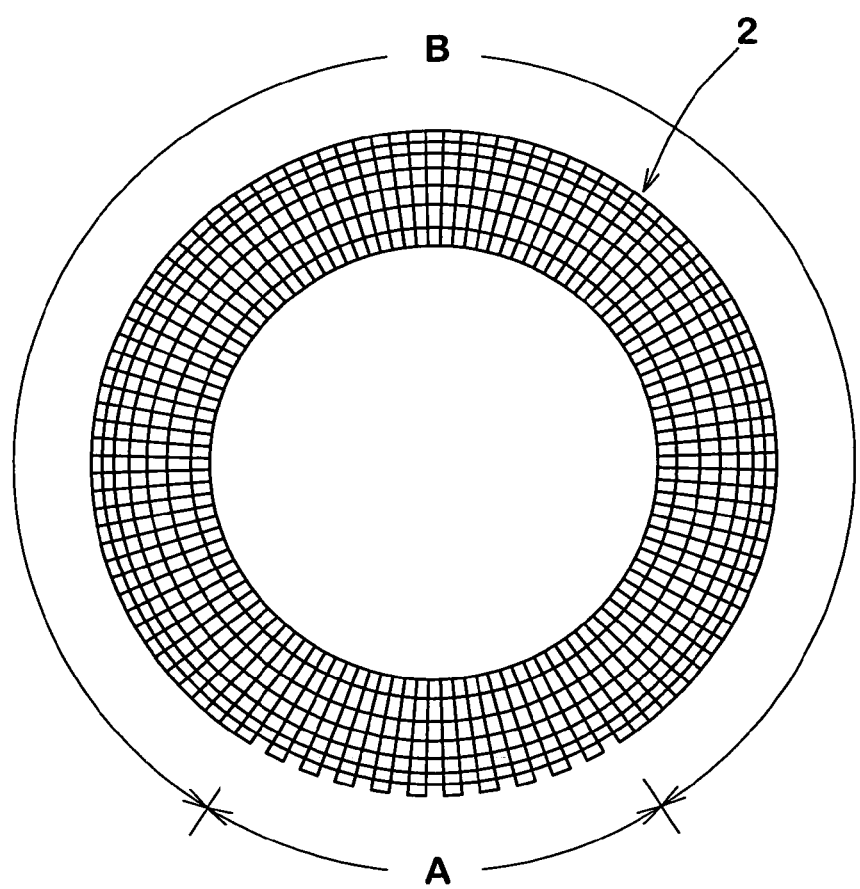
FIG. 4 is a side view of the tire model in another embodiment.

As shown in FIG. 4, the tire model 2 could be, but not limited to, a combination of the detailed pattern part "A" which has modeled grooves on the tread and the simple pattern part B which has no grooves on the tread. The detailed pattern part "A" is longer than the tread ground contact portion in the tire circumferential direction, but is shorter than the simple pattern part B. This helps to accelerate the calculation time by reducing the number of elements in the tire model 2 as a whole.

Figure 5:
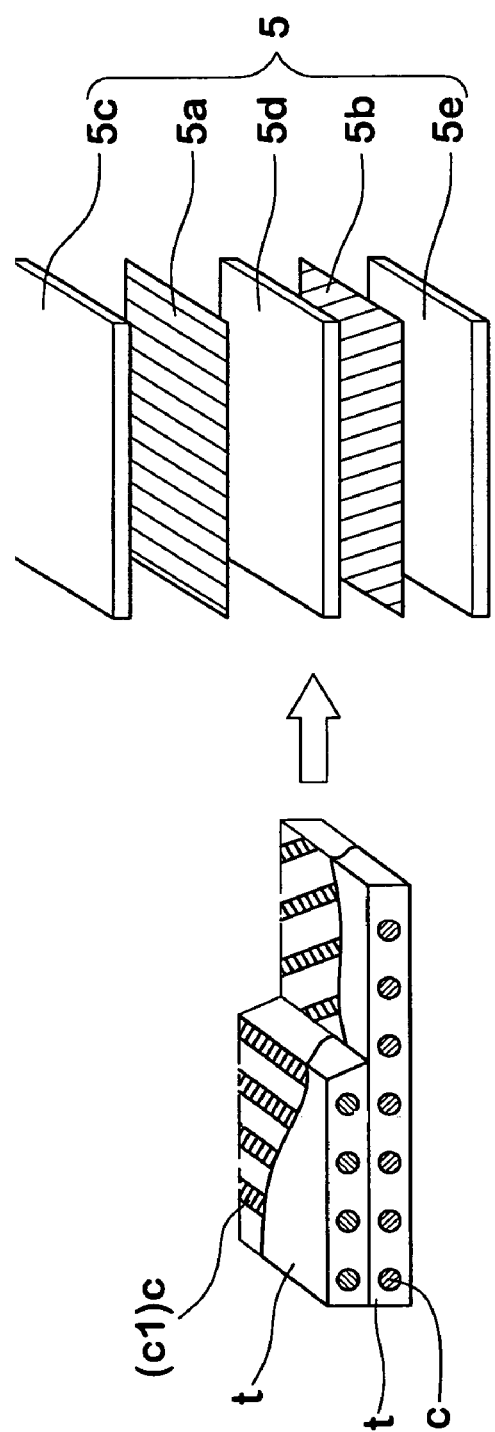
FIG. 5 is a perspective view explaining the modeling of cord reinforcements.

FIG. 5 shows an example of modeling of a cord reinforcement member c such as a belt ply, a carcass ply or the like. The cord reinforcement members c are modeled into membrane elements 5a and 5b, and the topping rubber part t is modeled into solid elements 5c, 5d and 5e. These elements are stacked in the direction of a thickness so as to form a shell element 5. The membrane elements 5a and 5b have anisotropy that is different stiffness in the longitudinal direction of the cord c1 and the direction orthogonal thereto. Further, a viscoelastic property is defined in the solid elements.

In the step S2 shown in FIG. 2, a sandy road model is set by modeling sandy road in finite volumes capable of the numerical analysis above.

Figure 6:
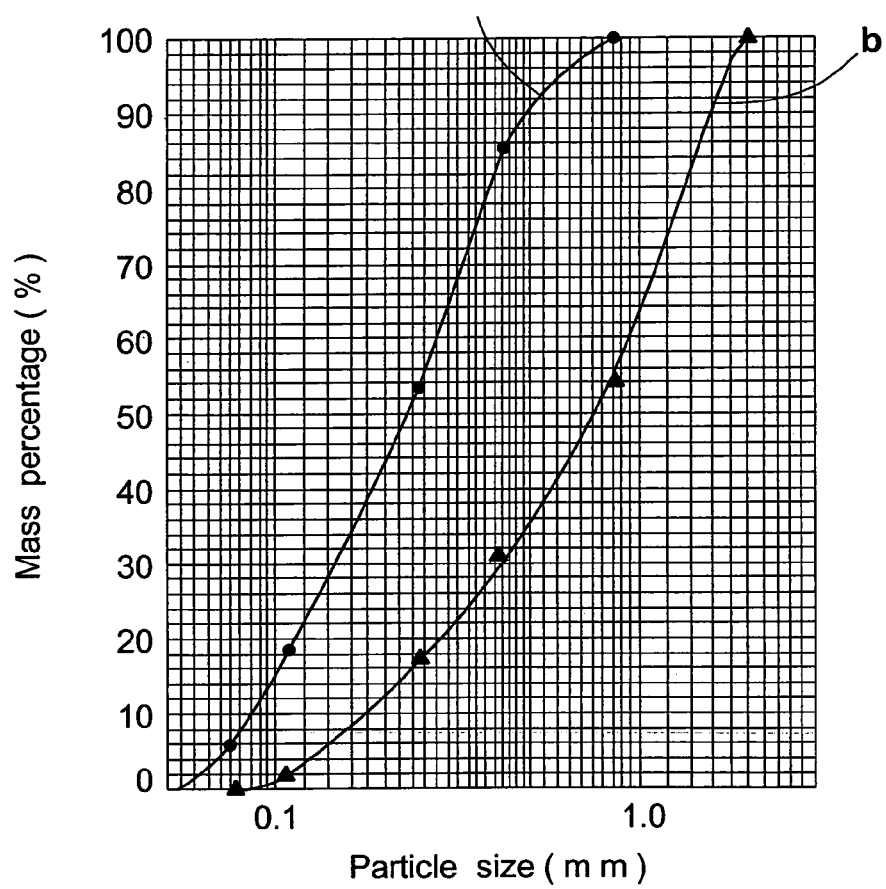
FIG. 6 is a graph showing a particle size distribution of sand.

In this embodiment, desert sand is used for the sandy road. However, other sand types may also be used. An example particle distribution of desert sand is shown as curve "a" in FIG. 6. Curve b shows "Toyoura standard sand" that is standard Japanese sand.

Figure 7:
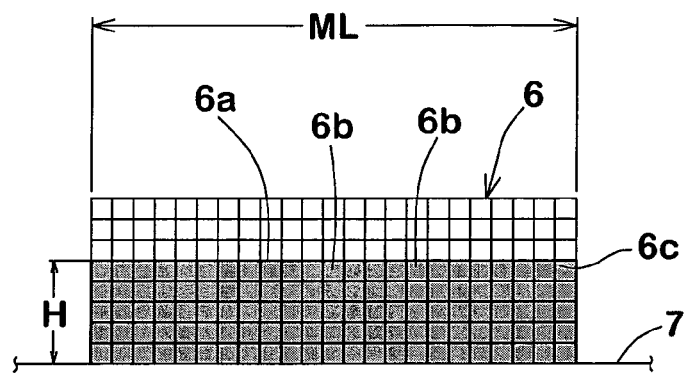
FIG. 7 is a side view which visualizes an example of a sandy road model.

The sandy road is modeled in this embodiment using Euler finite volumes. FIG. 7 shows an example of the sandy road model 6. The sandy road model 6 comprises: a three-dimensional regular finite volume mesh 6a fixed on the stiff element 7; and the numerical sand material 6c corresponding to the sand packed in the spaces 6b divided by the mesh 6a.

The sand material 6c can move in the space of the mesh 6a having a bottom and side walls. The thickness H of the sand material 6c corresponds to the thickness of the sand layer to be evaluated. In this embodiment, the thickness is taken large enough to represent deep sand. Here, the term "one volume of the sandy road model" means one hexagonal space 6b and the numerical sand material 6c therein.

Further, the sandy road model 6 has a width and a length ML as necessary for the rotation of the tire model 2.

Figure 8A:
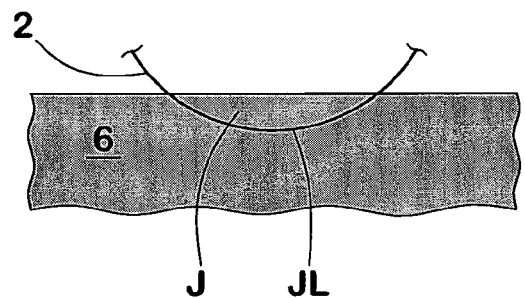
FIGS. 8(A) and 8(B) are side views showing an interaction between the tire model and the sandy road model.
Figure 8B:
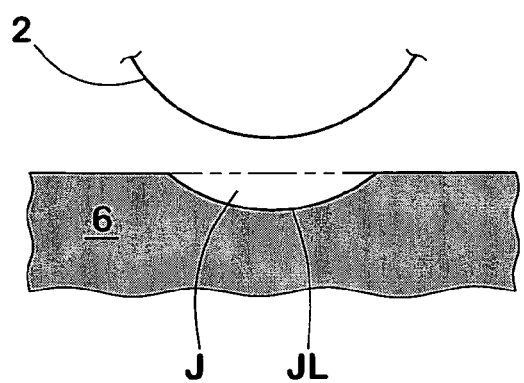

FIGS. 8A and 8B show a state in which the sandy road model 6 gets into contact with the tire model 2. In the deformation calculation of the tire model 2 and sandy road model 6 described later, the crossing portion J between the tire model 2 and the numerical sand material 6c is calculated based on mutual position information. Then, the tire model 2 and the sand material 6c are coupled at the boundary JL of the crossing portion J so as to interact with each other. Namely, the sand material 6c provides reaction force to the tire model 2 through the boundary JL. On the other hand, the tire model 2 provides the sand material 6c with a moving boundary surface (coupling surface). Therefore, sand material 6c in the cross portion J is moved out of the model so that the sand material 6c deforms along the tread of the tire model.

Further, elastoplasticity is defined in the sand material 6c. The elastoplasticity is a state of a substance subjected to a stress greater than its elastic limit but not so great as to cause it to rupture, in which it exhibits both elastic and plastic properties. Namely, the numerical sand material 6c can change its physical property according to its state of the stress. The inventors have found that the behavior of desert sand with, but not limited to, a particle size of from about 0.050 to about 0.80 mm can be represented by elastoplasticity. Accordingly, by defining such an elastoplasticity into the sandy road model 6, it is possible to obtain the tire performance on sand with high accuracy by the simulation.

The elastoplasticity is to be set according to sand properties which are to be evaluated for the target sand. In this embodiment, in order to satisfy this requirement, the elastoplasticity of the sand is determined based on results of triaxial compression tests in which the sand is compressed with an axial force under an external pressure that is kept constant.

Figure 9:
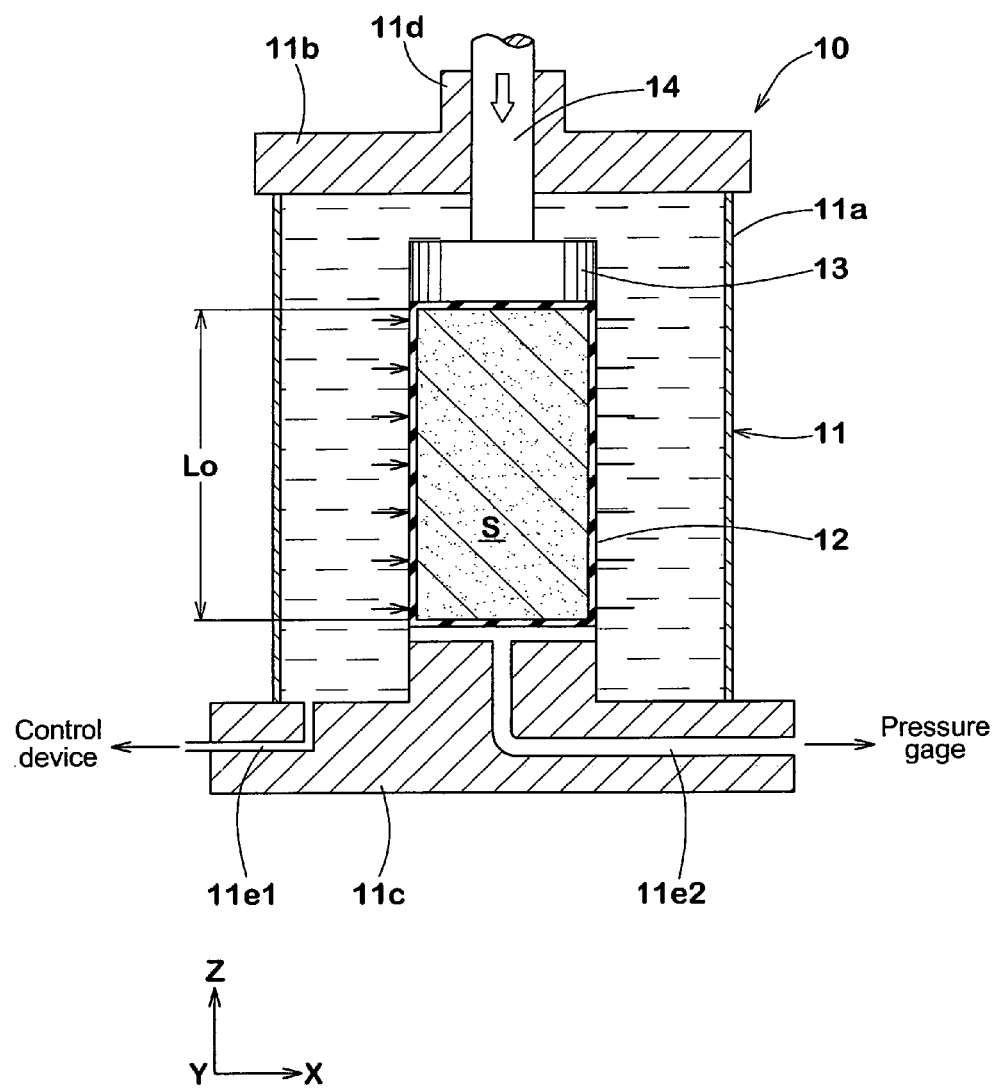
FIG. 9 is a front view of a compression test machine for sand.

FIG. 9 schematically shows an example of a compression test machine 10 for sand. The compression test machine 10 comprises: a pressure chamber 11 filled with a liquid such as water; a cylindrical container 12 packed with sand and placed inside the chamber 11; and an actuator 14 which can apply an axial compressive force on the container 12 and the sand inside.

The pressure chamber 11 comprises: a cylindrical main body 11a having a space therein; an upper cover 11b to close a top of the main body 11a with a guide 11d for the piston rod of the actuator 14; and a bottom cover 11c to close the bottom of the main body 11a. The internal pressure of the chamber 11 is kept constant by controlling amount of the liquid using a control device (not shown). The bottom cover 11c is provided with a passage 11e1 connecting the bottom of the container 12 to the control device and a second passage 11e2 connected to a pressure gage (not shown).

The cylindrical container 12 has a thin and soft side wall made of rubber or the like such that it does not have substantial stiffness. In this embodiment, the container 12 has a diameter of about 5 cm. Further, test sand S is tightly packed in the container 12. Therefore, the sand S receives pressure from the liquid in the chamber 11 through the soft side wall of the container 12. Further, the bottom of the container 12 is fixed on the lower cover 11c, and its top is pushed by the piston rod of the actuator 14. Also, the sidewall of the container 12 receives liquid pressure in the chamber 11. The liquid pressure in the chamber 11 is defined as external pressure for the sand S. Since the physical property of sand varies according to the stress state thereof, it is desirable that the compression test is performed under at least two, or preferably three different levels of external pressure acting on sand. Further, the levels of external pressure are preferably determined in consideration of the contact pressure of the tire. In this embodiment, the sand compression tests have been performed under three levels of external pressure of 0.5 kgf/cm$^2$ (49 kPa), 1.0 kgf/cm$^2$ (98 kPa) and 2.0 kgf/cm$^2$ (196 kPa), respectively.

In this triaxial compression test, the following steps are performed: setting the external pressure being applied to the container 12; compressing the container 12; and measuring various parameters such as the force, the displacement and/or the volume change of the sand.

Figure 10:
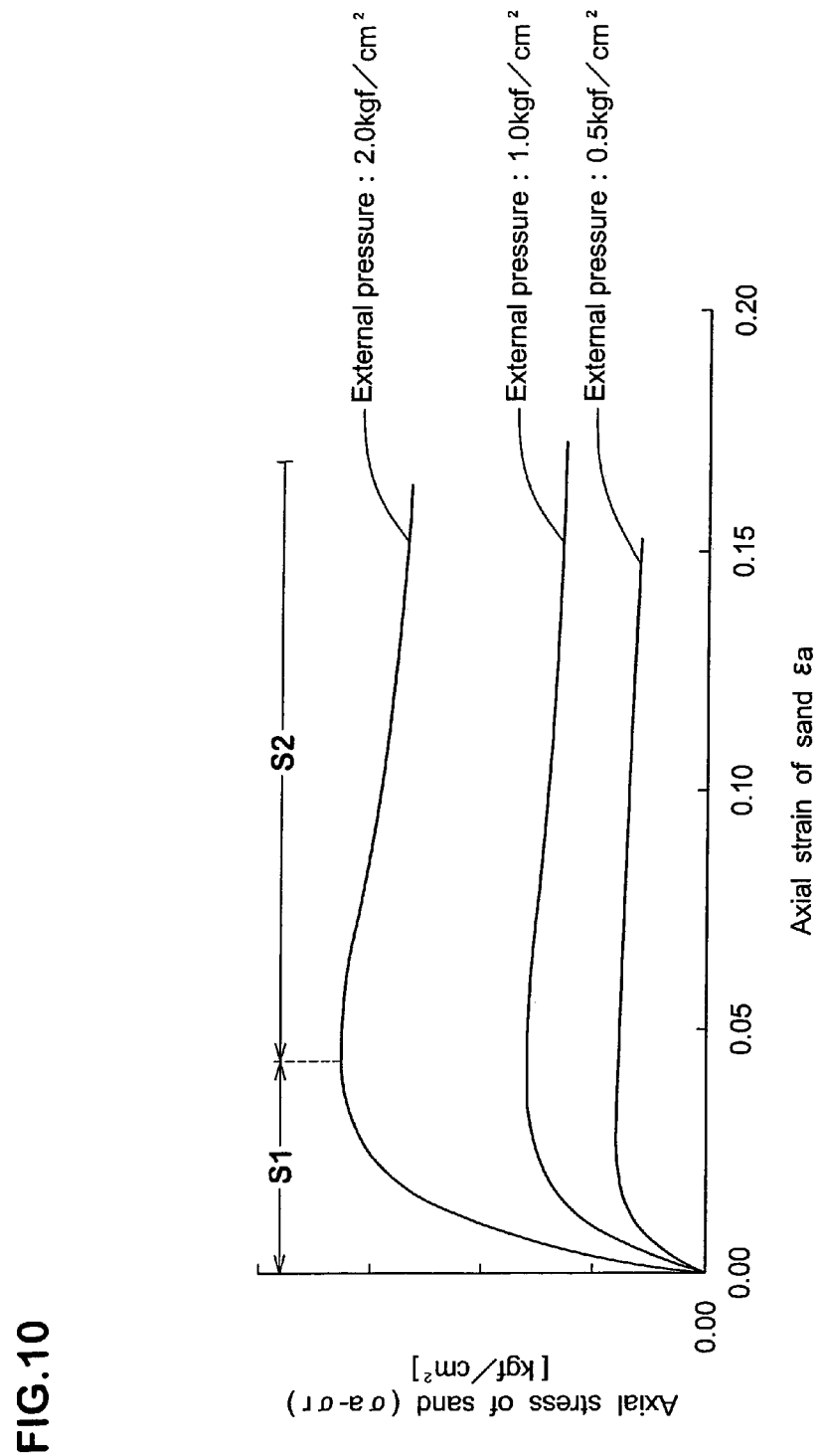
FIG. 10 is a graph showing a typical relationship between the axial strain and the stress of sand.

In such a compression test, the sand s filled in the container 12 is in a triaxial stress state receiving external pressure in X, Y and z directions and compressive axial force in z direction from the actuator 14. Under a constant external pressure, when increasing the axial force, particles of the sand begin to slip, and then the container 12 bulges in its radial direction. As shown in FIG. 10, the relationship between the axial stress and the axial strain of the sand is obtained from the result of these compression tests.

More specifically, the vertical axis in FIG. 10 shows the deviatoric stress (σa-σr) of the sand, and the horizontal axis shows the axial strain ϵa of the sand. These are calculated as follows.

$$\epsilon a = \Delta L/L0$$

L0: original axial length of the sand filled in the container
ΔL: change of axial Length of the sand
σa: Maximum principal stress (=$F_{ext}$/A)
$F_{ext}$: axial compressive force
A: current nominal cross-section area of the sand filled in the container
σr: minimum principal stress (=external pressure acting on sand)

FIG. 10 shows that the relationship between the axial stress (σa-σr) and the axial strain ϵa of the sand varies according to the external pressure. Further, in each curve shown in FIG. 10, when the sand S is compressed with a constant external pressure, the axial stress (σa-σr) increases due to the sand particles resistance to sliding caused by friction between sand particles. Sliding is started between the particles having smaller contact force and gradually increases as the axial force increases, until complete sliding occurs at the peak of the axial stress-strain curve. This sliding also causes the increase of the stress to slow down. This means that sand exhibits elastoplasticity. As sliding continues after the peak of the axial stress, the axial stress decreases slowly until it is saturated.

When the external pressure is higher, the axial stress is also higher. Therefore, it can be anticipated that reducing sand flow under the tire by increasing sand pressure improves the tire performance on sand.

In this embodiment, the stress-strain relationship under three different levels of external pressures as obtained in the compression tests are defined as the elastic-plastic relationship of the sandy road model 6. In other words, in the simulation step, each finite volume of the sandy road model 6 behaves according to the relationship shown in FIG. 10. Further, these relationships shown in FIG. 10 are memorized in the computer device 1. For example, the three curves shown in FIG. 10 may be memorized converted into functions and/or approximate curves. In this way the elastoplasticity of the sandy road model 6 is set.

In a computer simulation, it is known that "Drucker-Prager model" and "Mohr-coulomb model" are used for soil and soil-like materials to express their yield condition. These models are especially used in simulation of structural foundations, and in earthquake engineering. However, it is clear from the result of the compression test that sand s has different properties from those material models.

For example, the relationship between axial stress and strain shown in FIG. 10 has a first region S1 and a second region S2. The first region S1 exhibits smooth increase of the strain with the increase of stress from zero to the peak (yield point), and the second region S2 exhibits smooth increase of the strain from the yield point with the decrease of stress. Decrease of the yield stress after the peak is brought by improvement of particles alignment due to sliding. Also corners of some particles break away making it easier to slide. However, conventional material models do not have especially the second region S2.

Figure 11:
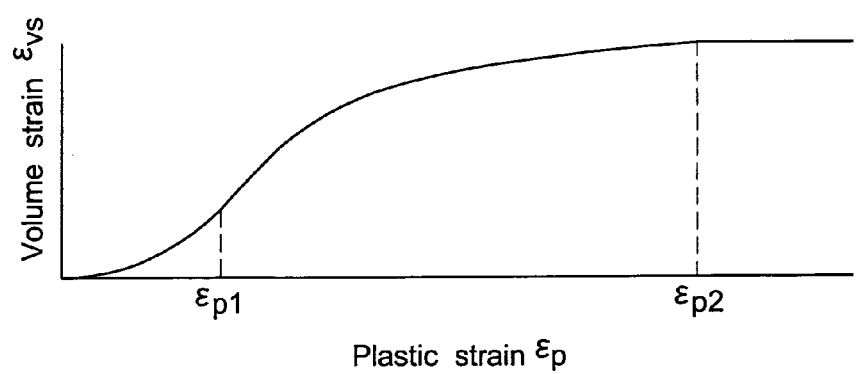
FIG. 11 is a graph showing a typical relationship between a plastic strain and volume strain.

The relationship between plastic strain ϵp of the sand and volume strain ϵvs based on this plastic strain as shown in FIG. 11 is further defined into the finite volume of the sandy road model 6. The total volume strain ϵv can be divided into two components, the volume strain ϵvs caused by the plastic strain ϵp and the volume strain ϵvp caused by the pressure. These are expressed as follows.

$$\epsilon v = (V-V0)/v0 = \epsilon vs + \epsilon Vp \quad (1)$$

V: volume of sand after deformation
V0: original volume of sand

The relationship shown in FIG. 11 is obtained from the compression tests described above. More specifically, the relationship between plastic strain and volume strain is obtained so as to satisfy the relationship between axial strain and volume strain as obtained from the tests.

Next, in step S3 in this present embodiment, boundary conditions for the simulation are set. The boundary conditions include wheel rims, internal pressure of the tire model 2, friction coefficient between the tire model 2 and the sandy road model 6, the tire load, the slip angle, the camber angle, rotating speed (In this embodiment, rotational and translational speeds are set to the tire model 2.), initial time increment for deformation calculation of each model and initial position of each model 2 and 6.

Figure 12:
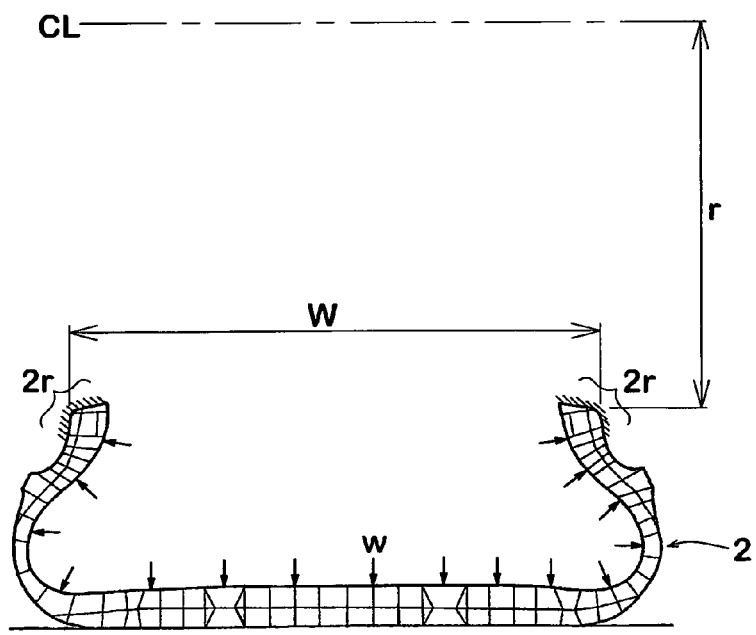
FIG. 12 is a cross sectional view of the tire model.

FIG. 12 shows the virtual rim assembly of the tire model 2. A pair of bead regions 2r of the tire model 2 are equal to the rim width. The radial distance r from the rotation axis CL of the tire model 2 to the bead regions 2r is set to be equal to the rim diameter. Further, the internal pressure is expressed by applying an uniformly distributed load having the same value as the internal pressure of the tire on the internal surface of the tire model 2.

Next, in the steps S4 to S8, deformation calculations of the tire model 2 and the sandy road model are performed. Namely, the state where the tire model 2 rolls on the sandy road model 6 is calculated for every small time increment by using the computer device 1.

The explicit time integration method is employed in the simulation in this present example. According to the explicit method, the moment that the load acts on each model is taken as time zero, and the time is divided into small increments so as to find the displacement of the model at each point in time. The explicit method does not involve convergence calculations. However, it is necessary that the time increment satisfies the "Courant criterion", in order to stabilize the calculations. To be more specific, the initial time increment Δt in the deformation calculation for the tire model 2 and the sandy road model 6 is set at the values which meet the following formula (2).

$$\Delta t < L_{min}/C \quad (2)$$

Figure 13:
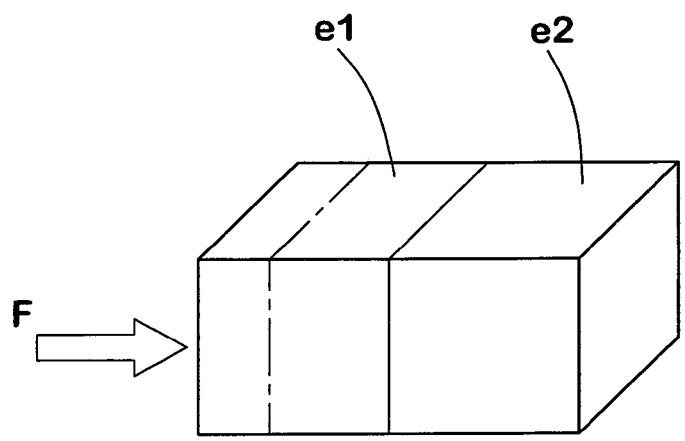
FIG. 13 is a perspective view of an element in the tire model.

Here, "$L_{min}$" is the characteristic length of the smallest element in each model, and "C" is the propagation speed of a stress wave propagating in the material calculated as follows:

$$C = (E/\rho)^{0.5}$$

Where E is Young's modulus, and ρ is the density. In the deformation calculations with a time increment that satisfies the Courant criterion, as shown in FIG. 13, it becomes possible to calculate the deformation condition of the element e1 when an external force F acts thereon before the external force F is transferred to the element e2 adjacent to the element e1. This helps to obtain stable solutions.

In this embodiment, the propagating time of the stress wave of each element is calculated based on the formula (2), and after that, the time increment is set up by multiplying the minimum of the propagating time by a safety factor. The safety factor is, for example, set of more than 0.66. Further, the initial time increment is preferably set of from 0.1 to 5

μsec, more preferably 0.3 to 3 μsec, and most preferably 0.5 to 2 μsec for both the tire model 2 and the sandy road model 6.

As shown in the Steps S4 to S8 in FIG. 2, the deformation calculation of the tire model 2 and the deformation calculation of the sandy road model 6 are performed separately. However, the position, the shape and the speed data of the tire model 2 obtained from the deformation calculation of the tire model 2 are given to the sandy road model 6 as a boundary condition for the deformation calculation of the sandy road model 6 (step S8). On the other hand, the pressure obtained from the deformation calculation of the sandy road model 6 are given to the tire model 2 as the boundary condition (load) for the deformation calculation of the tire model 2 (step 57).

Figure 14:
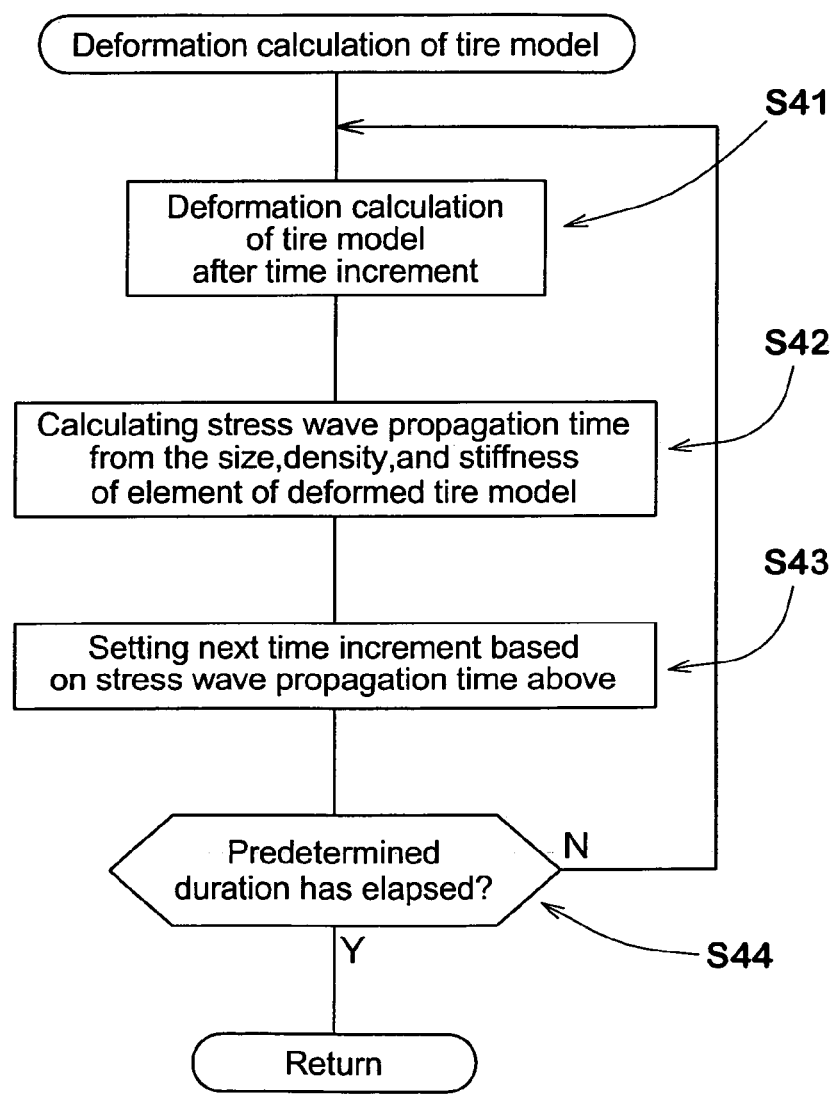
FIG. 14 is a flowchart showing an example of the deformation calculation of the tire model.

FIG. 14 shows an example of the deformation calculation of the tire model 2. In step S41 shown in FIG. 14, the deformation calculation after the time increment Δt is performed first. The deformation calculation in the present example is performed by finite element method using governing equations of motion.

Next, the stress wave propagation time of each element of the deformed tire model 2 is calculated based on its size, density and stiffness (step S42). Then, based on the minimum value of this stress wave propagation time, the time increment for the next deformation calculation is set so as to satisfy the courant criterion above (step S43). since the stress wave propagation time is a function of the size and density of the element, it changes every time the element deforms. In the present embodiment, the optimum time increment is set in accordance with the deformation of the element, which helps the deformation calculation of the tire model 2 to be performed more accurately.

Next, it is checked whether the predetermined duration of simulation time has been elapsed or not (step S44). when "NO" is selected in the Step S44, the process goes back to the step S41 to perform one more calculation by adding the newly set time increment. When "Yes" is selected in the Step S44, the deformation calculation of the tire model 2 is terminated and the process goes to the Step S6.

Figure 15:
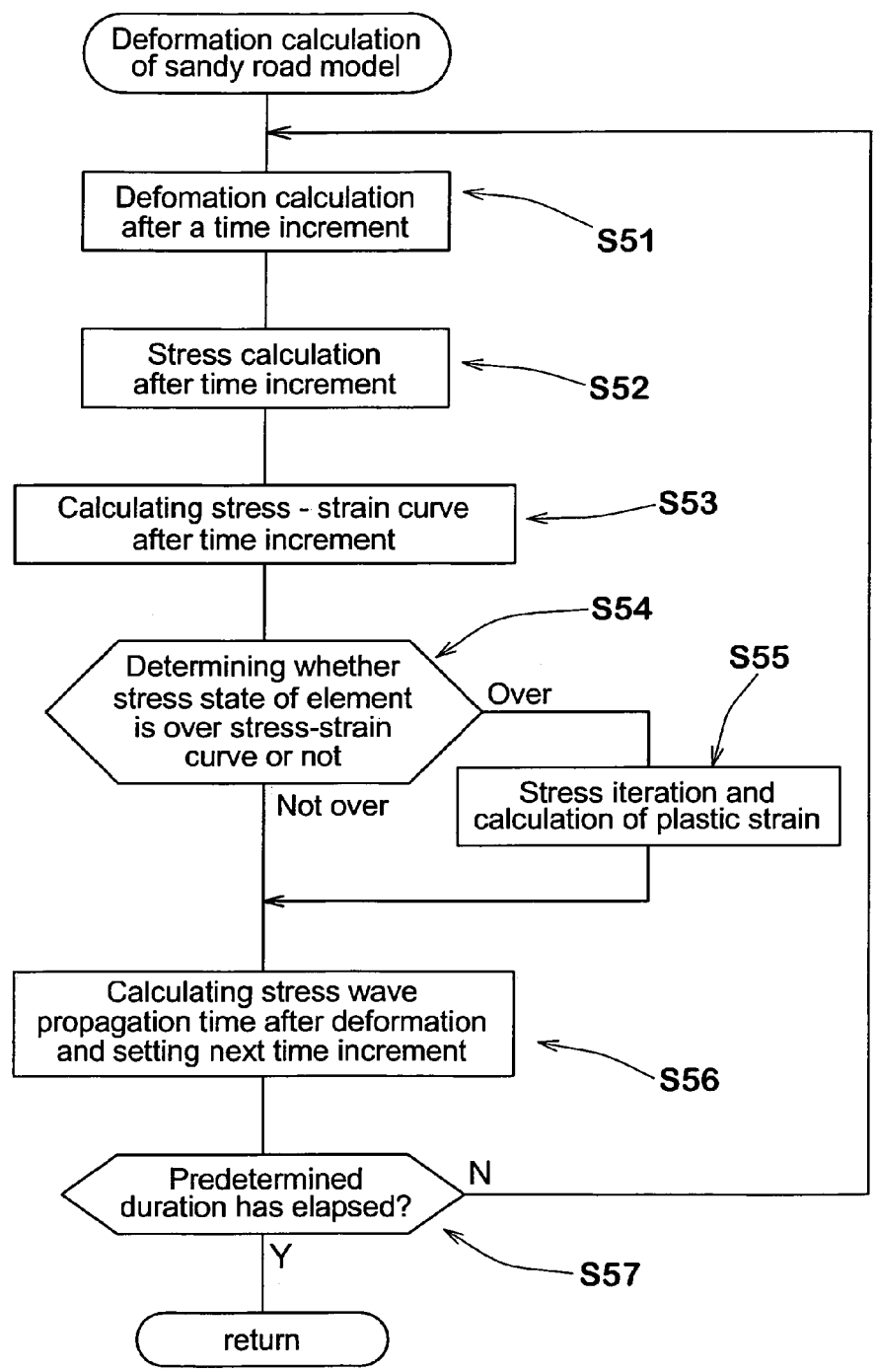
FIG. 15 is a flowchart showing an example of the deformation calculation of the sandy road model.

FIG. 15 shows an example of the deformation calculation of the sandy road model 6. The deformation calculation of the material in each finite volume of the sandy road model 6 is performed after the time increment (step S51). In this step 51, the density p of each finite volume of the sandy road model 6 is calculated.

Next, the volume strain $\epsilon vs$ of each finite volume of the sandy road model 6 due to the plastic strain is calculated based on the relationship shown in FIG. 11 and the plastic strain $\epsilon p$ calculated in the prior calculation loop.

Next, the volume strain $\epsilon vp$ due to pressure is calculated by the following formula (3).

$$\epsilon vp = \epsilon v - \epsilon vs \quad (3)$$

Here, the volume strain $\epsilon v$ is calculated by the following formula (4) using the current density ρ of each finite volume of the sandy road model 6.

$$\epsilon v = 1 - (\rho/\rho 0) \quad (4)$$

Here, ρ0 is the initial density of the finite volume under zero pressure. Here, the compressive volume strain is expressed as negative.

Next, the pressure P after the time increment passed is calculated by the following formula (5).

$$P = a1 \cdot \mu + s \cdot 2\mu^2 \quad (5)$$

The pressure P is the average value of the three normal stress components which act on each finite volume. Further, "a1" and "a2" are material parameters, μ is the volume-compression rate (compression is positive) defined by the following formula (6).

$$\mu = -\epsilon vp = -\epsilon v + \epsilon vs = (\rho/\rho 0) - 1 + \epsilon vs \quad (6)$$

Next, the stress calculation of the sandy road model 6 after the time increment is performed (Step S52). In this stress calculation, the second invariant $J_2$ of the stress tensor of each finite volume of the sandy road model 6 are calculated using deviatoric stresses of each elements. Each of the normal deviatoric stresses σx', σy', and σz' is calculated by subtracting the pressure P evaluated above from each of the normal stresses, σx, σy, and σz.

$$\sigma x' = \sigma x - P \quad (7)$$

$$\sigma y' = \sigma y - P \quad (8)$$

$$\sigma z' = \sigma z - P \quad (9)$$

The second invariant $J_2$ of the stress tensor is calculated by the following equation (10) using the above deviatoric stress and shear stress components.

$$J_2 = \sigma x' \cdot \sigma y' + \sigma y' \cdot \sigma z' + \sigma z' \cdot \sigma x' - \tau xy^2 - \tau yz^2 - \tau zx^2 \quad (10)$$

In this equation, τxy, τyz, and τzx are the shear stress components. In this step, strain increments of each finite volume is considered as elastic.

Next, the stress-strain curve of each finite volume of the sandy road model 6 after the time increment is calculated. Since the pressure P of each finite volume has already been calculated in Step S51, the stress-strain curve corresponding to the pressure P is obtained based on the predetermined elastoplastic stress-strain curve shown in FIG. 10 (step S53). This curve is a condition to identify the yield condition corresponding finite volume of the sandy road model 6. Further, since only three levels of external pressures are defined in FIG. 10, the relationship between the stress and the strain under different pressures can be obtained using interpolation.

In step S54, it is checked whether the present stress state of each finite volume is over the stress-strain curve or not. When it has been determined that the stress of the element is over the stress-strain curve, an iteration process for decreasing the stress is performed in step S55.

Figure 16:
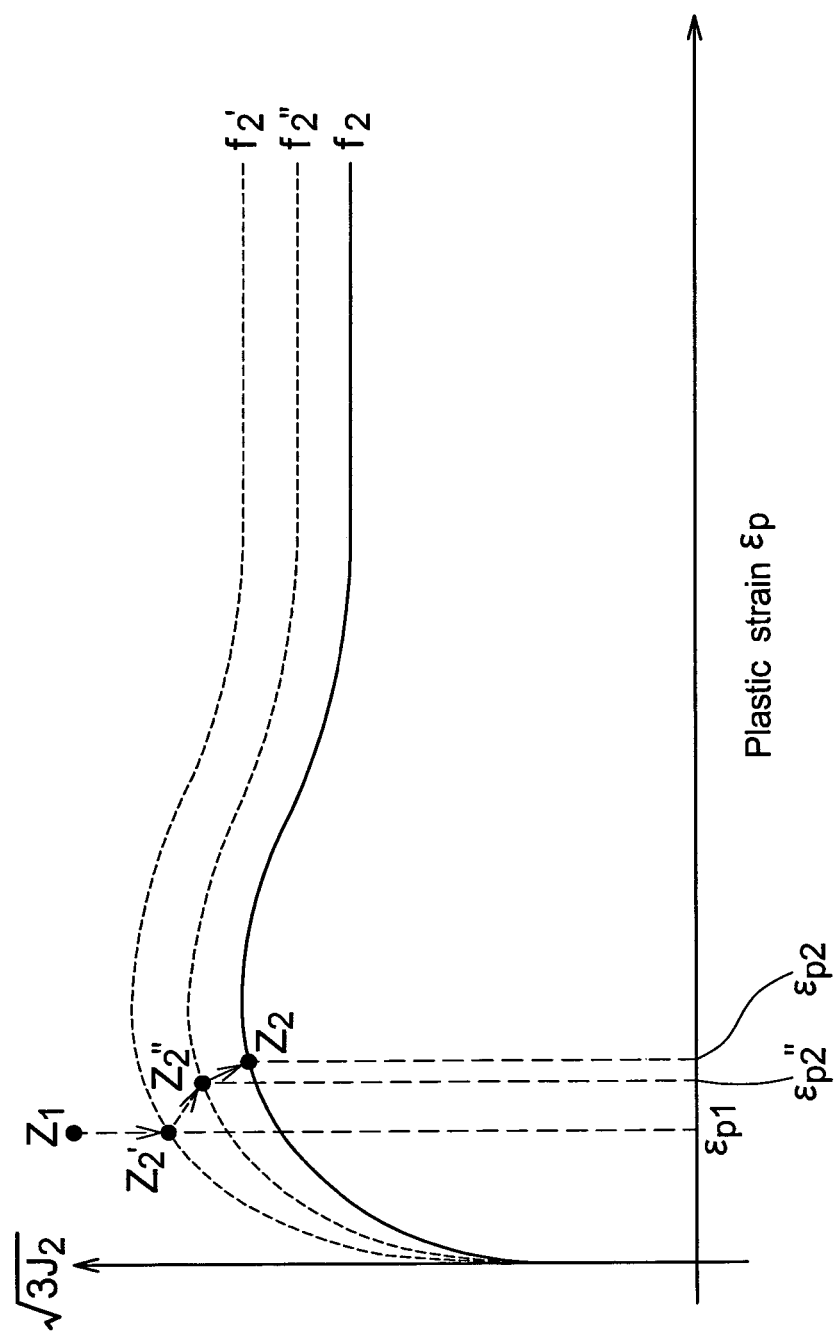
FIG. 16 is a graph showing the relationship between plastic strain and deviatonic stress.

FIG. 16 shows the relationship between the parameter $(3J_2)^{0.5}$ using the second invariant $J_2$ and the plastic strain $\epsilon p$ of one finite volume of the sandy road model 6. Here, the plastic strain $\epsilon p$ can be calculated from the total strain, stress, the stress-strain matrix D and the following stress-strain relationship.

$$\Delta\sigma = D \cdot \Delta\epsilon$$

To describe an example of steps S54 and S55, a finite volume is now assumed in a state of z1 and the stress-strain curve is assumed as the curve f2' as shown in FIG. 16. The state of z1 of the finite volume is over the curve f2'. This means that the deformation of the material is in a plastic region, and an iteration step is performed.

The iteration process may be performed in various ways; in this embodiment the iteration process to decrease the stress of the finite volume is performed until the state z1 becomes on the stress-strain curve. Specifically, the process decreases the stress of the finite volume to state z' to the stress-strain curve f2' without changing the plastic strain $\epsilon p1$ of the state z2'.

Next, a new plastic strain ∈p2″ is obtained by considering the strain caused by reducing the stress from the state z1 to z2′ as a plastic component.

Next, a new pressure P of the finite volume is calculated using the stress state of z2′. Then, a new stress-strain curve f2″ is calculated based on the latest pressure P and the relationship of FIG. 10. Then, a new stress state z2″ with a plastic strain ∈p2″ which lies on the stress-strain curve f2″ is calculated. Further, the plastic strain and the pressure of the finite volume are recalculated, and these process continues until the stress state of the finite volume converges on the stress-strain curve. Accordingly, the stress state z1 of the finite volume is finally decreased to the stress state z2 on the stress-strain curve f2.

Next, in this embodiment, the stress wave propagation time of each finite volume of the deformed sandy road model 6 is recalculated, and a value equal to the minimum value of the stress wave propagation time multiplied by the safety factor is set as the next time increment (step S56).

Next, it is checked whether the predetermined simulation duration has elapsed or not (step S57). When it has not, the process goes back to Step S51 and recalculation is performed again with the newly set time increment. When it has elapsed, the deformation calculation of the sandy road model 6 is terminated to return to step S6 of FIG. 2.

In steps S7 and S8 in FIG. 2, necessary data obtained from the results of the individual calculations of the tire model 2 and sandy road model 6 are exchanged between these models so as to couple them. The pressure data of the sandy road model 6 is given to the tire model 2 as a load for next deformation calculation thereof. On the other hand, the shape and speed of the tire model 2 are given to the sandy road model 6 as a boundary condition for the next deformation calculation thereof.

Accordingly, it becomes possible for the sandy road model 6 to calculate changes in the reaction force on the tire model 2 due to changes in the position or shape of the tire model 2. For the tire model 2, it becomes possible to calculate a new deformation due to the reaction force received from the sandy road model 6. Repeating these calculations can analyze the changing contact situation between the tire model 2 and the sandy road model 6, while considering their interaction.

In step S6, it is checked whether the predetermined duration which indicates the completion of calculation has elapsed or not. When "YES" is selected in step S6, the calculation results are outputted (Step S9), and the simulation procedure is terminated. The duration of the calculations in Step 56 can be determined according to the simulation to be executed so as to obtain stable calculation results.

The output of the calculation results may contain various information. For example, pressure and plastic strain distribution of the sandy road model 6 and longitudinal and side force applied on the tire model 2 may be obtained. Any physical parameters involved in the tire model 2 and the sandy road model 6 calculations may be obtained as output information.

Based on the outputted information, designers and analysts can device modifications of internal structure of tire, profile of tread, tread patterns or sipes, internal pressure of tire, and used rubber materials. It is also possible to prototype the tire version which have shown preferable simulation results. This greatly accelerates the process of development of tires for sand, thereby reducing the development time and cost.

Figure 17:
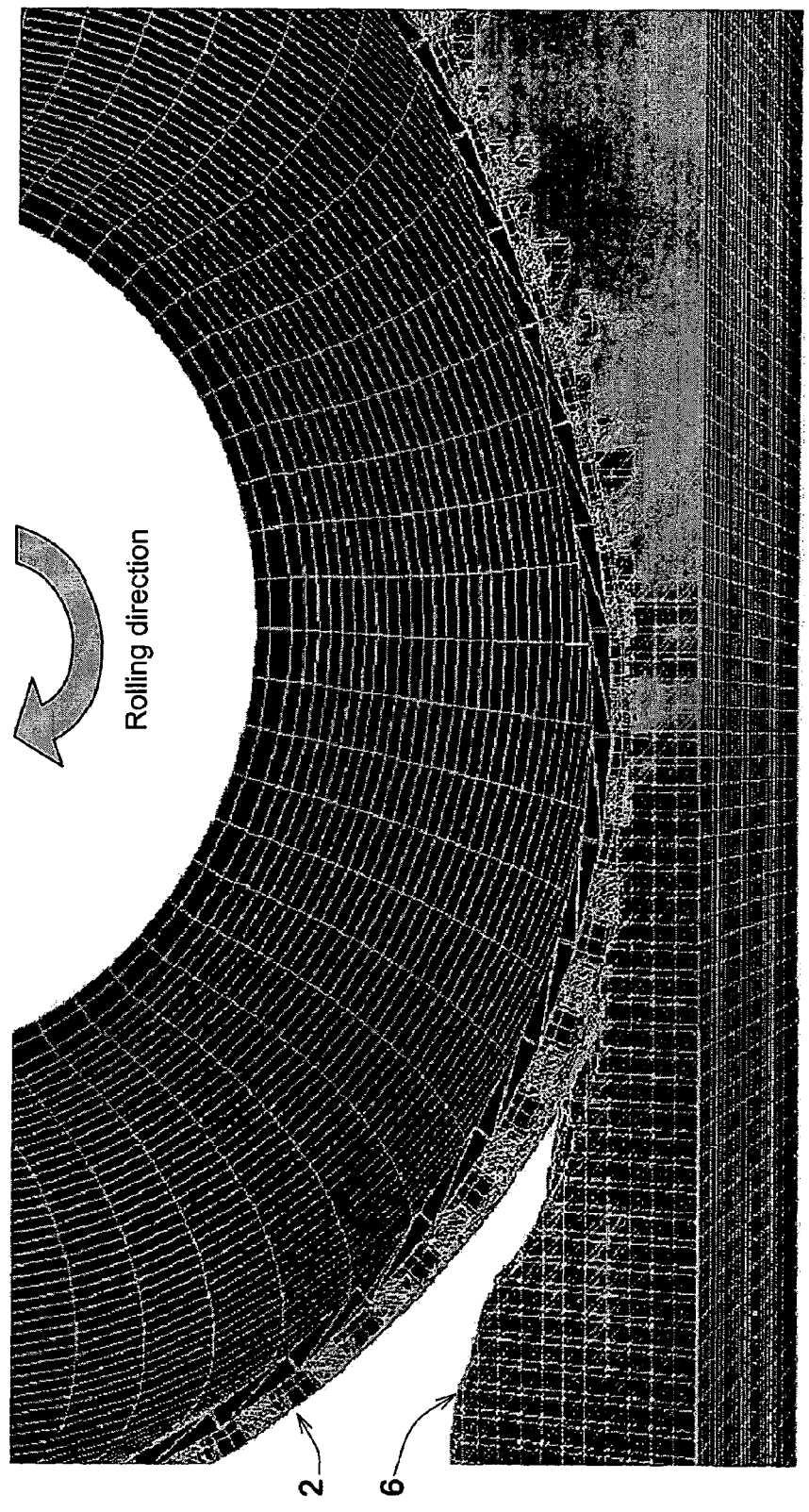

FIG. 17 illustrates a visualized example of the simulation result of pressure distribution of the tire model 2 and sandy road model 6. As shown in FIG. 17, the tire model 6 is drawn as a section taken along the tire equator. The tire model size is 265/70R16, the internal pressure is 220 kPa, the tire load is 6.37 kN and the travel speed is 50 km/H. A whiter part shown in FIG. 17 has a higher stress. It may be seen from the result that the sand under the toe side of the tread has a larger stress. The sand with larger stress causes the tread to deform radially toward the inside of the tire, and it causes the rolling resistance to increase.

Figure 18:
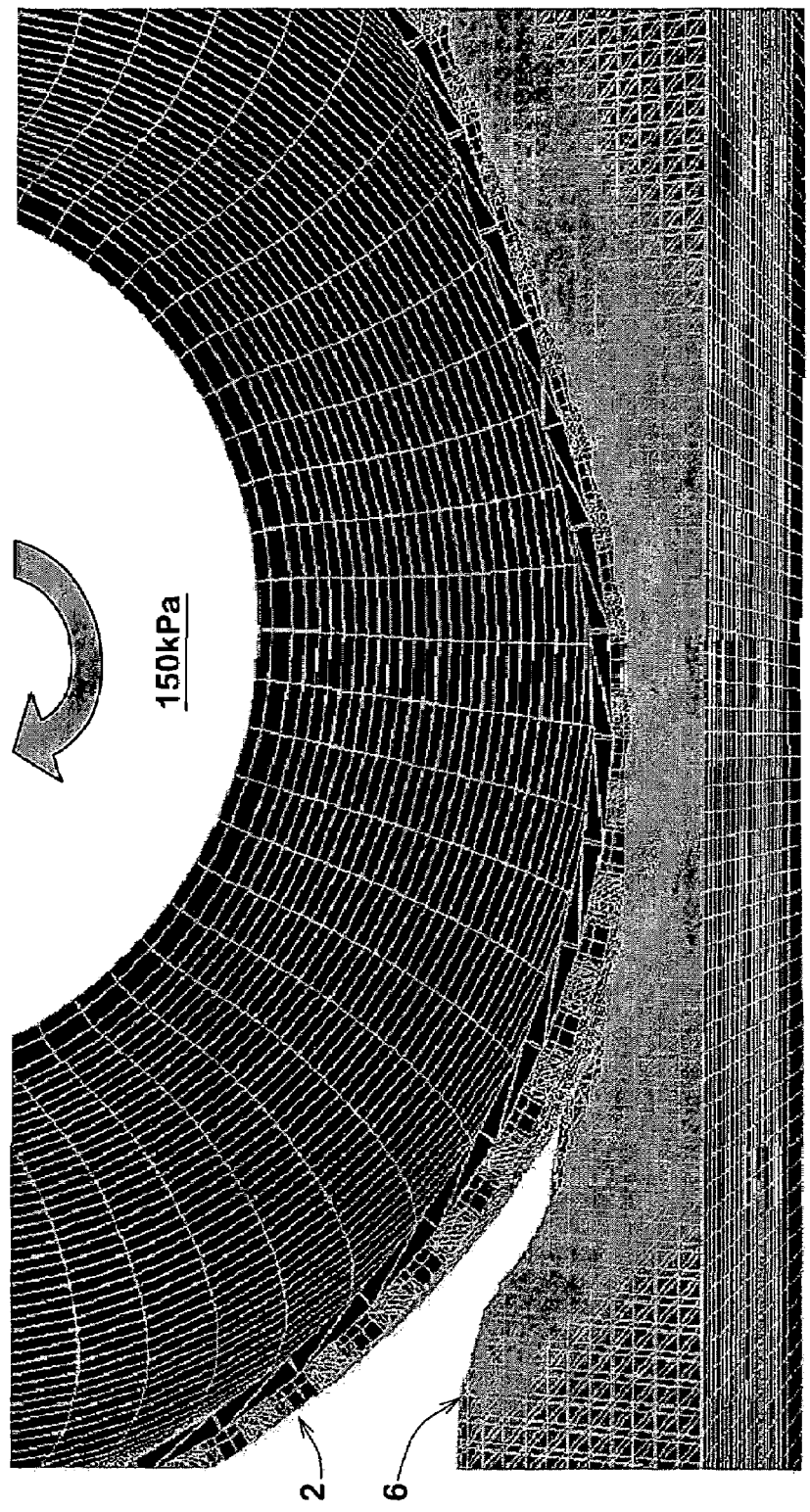

FIGS. 18 and 19 also show visualized examples of the simulation result of plastic strain distributions of the tire model 2 and sandy road model 6. The internal pressure of the tire model 2 shown in FIG. 18 is 150 kPa, and the internal pressure shown in FIG. 19 is 220 kPa. Here, a whiter part of the sandy road model 6 shown in FIGS. 18 and 19 has a higher plastic strain. When the internal pressure of the tire model 2 is lower, it may be seen that the deformation of the tread is larger but the plastic strain of the sand is smaller. This means that the rolling resistance of the tire is smaller. That is, this result coincides with the fact that a better running performance is obtained with low internal pressure when running on desert sand roads.

In this embodiment described above, the tire model 2 is made to roll on a stationary sandy road model 6. However, it is possible that a tire model 2 with a free rotating tire axis is driven by friction force from a moving sandy road model 6 in contact with the tread of the tire model 2.

The invention claimed is:

1. A method for tire rolling simulation on sand comprising the steps of:
   modeling a tire using finite elements to build a tire model;
   modeling a sandy road covered with sand using finite volumes to build a sandy road model which can exhibit elastoplasticity with both elastic and plastic properties; and
   executing a numerical simulation in which the tire model is made to roll on the sandy road model in a predetermined condition.

2. The method for tire rolling simulation on sand according to claim 1, wherein
   the elastoplasticity is defined using a predetermined relationship between the stress and the strain of the sand, and
   the relationship is obtained from triaxial compression tests in which the sand is compressed with an axial force under at least two different levels of external constant pressure.

3. The method for tire rolling simulation on sand according to claim 2, wherein
   the relationship between the stress and strain of the sand has a first region and a second region,
   the first region exhibits a smooth increase of strain with increase of the stress, and
   the second region exhibits a smooth decrease of stress from the yield point with increase of the strain.

4. The method for tire rolling simulation on sand according to claim 1, wherein
   the executing step comprises
   determining whether deformation of sand in each finite volume of the sandy road model is in a plastic region or an elastic region, and
   reducing the stress of the finite volume of the sandy road model when the deformation of the volume has been determined to be the plastic region.

* * * * *